United States Patent [19]

Kashiwagi

[11] Patent Number: 4,746,819
[45] Date of Patent: May 24, 1988

[54] PHASE SHIFTING CIRCUIT FOR PULSE SIGNALS

[75] Inventor: Shigeru Kashiwagi, Noda, Japan

[73] Assignee: Victor Company of Japan, Ltd., Tokyo, Japan

[21] Appl. No.: 939,631

[22] Filed: Dec. 9, 1986

[30] Foreign Application Priority Data

Dec. 10, 1985 [JP] Japan .................................. 60-277436

[51] Int. Cl.$^4$ .......................... H03K 5/13; H03K 5/22; H03K 3/284
[52] U.S. Cl. .................................. 307/511; 307/262; 307/273; 328/55; 328/155
[58] Field of Search ............... 307/511, 269, 262, 273, 307/514, 516, 593, 608, 603; 328/55, 155, 72, 63

[56] References Cited

U.S. PATENT DOCUMENTS

| | | | |
|---|---|---|---|
| 3,646,370 | 2/1972 | Lowe | 307/273 |
| 3,713,145 | 1/1973 | Butler et al. | 307/273 |
| 3,935,392 | 1/1976 | Smith et al. | 328/164 |
| 4,003,078 | 1/1977 | Owen | 307/262 |
| 4,370,617 | 1/1983 | Brandt | 328/72 |

Primary Examiner—Stanley D. Miller
Assistant Examiner—Timothy P. Callahan
Attorney, Agent, or Firm—Michael N. Meller

[57] ABSTRACT

A phase shifting circuit for shifting a phase of an input pulse signal comprises a first circuit for delaying the input pulse signal so as to produce a first pulse signal having a first pulse width, a second circuit for delaying the first pulse signal so as to produce a second pulse signal having a second pulse width, a smoothing circuit for smoothing the second pulse signal, and a comparing circuit for comparing an output signal level of the smoothing circuit with a predetermined reference level so as to produce a control signal dependent on a difference between the two compared levels. The control signal is supplied to the first and second circuits to control delay times thereof so that the first and second pulse widths respectively become constant. The second delay circuit produces the second pulse signal as an output pulse signal of the phase shifting circuit having a period essentially identical to that of the input pulse signal but having a phase which is shifted by a predetermined quantity with respect to the phase of the input pulse signal, where the predetermined quantity is substantially constant regardless of a period of the input pulse signal.

10 Claims, 3 Drawing Sheets

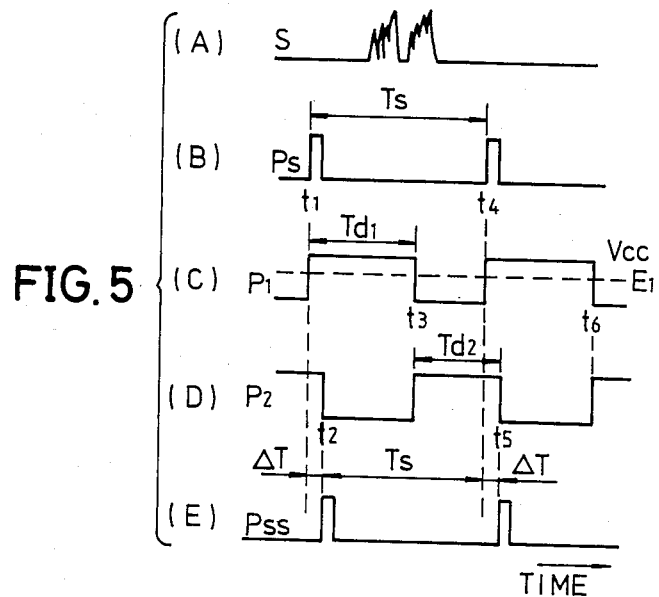

PHASE SHIFTING CIRCUIT FOR PULSE SIGNALS

BACKGROUND OF THE INVENTION

The present invention generally relates to phase shifting circuits for pulse signals, and more particularly to a phase shifting circuit for outputting an output pulse signal by shifting the phase of an input pulse signal while maintaining the phase relationship between the input pulse signal and the output pulse signal substantially constant even when the period of the input pulse signal changes.

Generally, in a display device such as a television receiver which uses a picture tube, a starting point of the raster is determined by a synchronizing signal for both the horizontal and vertical directions on the screen. But in some cases, it is desirable to start the raster from a point which is shifted from the starting point determined by the synchronizing signal. For example, in the display device for a computer, it is necessary for the relative position between the synchronizing signal and the picture information to be freely adjustable since the time position relationship between the synchronizing signal and the picture displayed on a screen is different depending on the type of the computer.

In other words, it will be useful if it is possible to produce a new pulse signal which has the same period as the synchronizing signal and has a phase which leads or lags the phase of the synchronizing signal by a predetermined time, and supply this new pulse signal to the display device as the synchronizing signal so as to determine the starting point of the raster. In this case, the relative position of the picture information with respect to the new synchronizing signal changes, and it becomes possible to freely adjust the position of the picture on the screen. In the case where the synchronizing signal is a vertical synchronizing signal, for example, the picture can be moved upwardly and downwardly on the screen. On the other hand, the picture can be moved rightwardly and leftwardly in the case where the synchronizing signal is a horizontal synchronizing signal.

As an example of a conventional phase shifting circuit which shifts the phase of an input pulse signal, there is a phase shifting circuit comprising first and second monostable multivibrators and a shaping circuit. The input pulse signal is delayed by a predetermined time in the first monostable multivibrator and is further delayed by a predetermined delay time in the second monostable multivibrator. An output signal waveform of the second monostable multivibrator is shaped in the shaping circuit into an output pulse signal which has the same period and approximately the same pulse width as the input pulse signal but is delayed by a predetermined time. The phase of the output pulse signal can be freely changed to lead or lag with respect to the phase of the input pulse signal by adjusting a variable resistor coupled to the second monostable multivibrator so as to vary the output pulse width of the second monostable multivibrator. Accordingly, in the case where the input pulse signal is the synchronizing signal, the output pulse signal can be supplied to the display device as the new synchronizing signal which determines the starting point of the raster so as to move the picture in the vertical or horizontal direction of the screen.

In the case where the period of the synchronizing signal is constant as in the case of the general television system, no problems will occur when the phase of the synchronizing signal is shifted in the conventional phase shifting circuit. However, in the case where picture information sources having different horizontal deflection frequencies coexist, problems described hereunder occur when the phase of the synchronizing signal is shifted in the conventional phase shifting circuit. For example, picture information sources such as computers and high definition television systems have horizontal deflection frequencies in the range of 15 kHz to 30 kHz.

In other words, when the conventional phase shifting circuit having the output pulse widths of the first and second monostable multivibrators set in accordance with the period of a first synchronizing signal from a first picture information source receives from a second picture information source a second synchronizing signal having a period shorter than the period of the first synchronizing signal, the phase of the output pulse signal (output synchronizing signal) becomes greatly deviated from the second sychronizing signal unless the output pulse widths of the first and second monostable multivibrators are newly set in accordance with the short period of the second synchronizing signal. In an extreme case where the period of the second synchronizing signal is shorter than the output pulse width of the first monostable multivibrator, no output pulse is obtained from the first monostable multivibrator and the phase shifting circuit as a whole will become inoperative. Hence, in the display device which may receive various picture information having synchronizing signals of different frequencies, the phase shifting circuit will not operate correctly unless the output pulse widths of the first and second monostable multivibrators are adjusted every time the input picture information changes. For this reason, there are problems in that the circuit construction of the phase shifting circuit becomes complex and that it is troublesome to make the necessary adjustments every time the period of the input pulse signal changes.

SUMMARY OF THE INVENTION

Accordingly, it is a general object of the present invention to provide a novel and useful phase shifting circuit for pulse signals in which the problems described heretofore are eliminated.

Another and more specific object of the present invention is to provide a phase shifting circuit comprising a first delay circuit for delaying an input pulse signal, a second delay circuit for delaying an output pulse signal of the first delay circuit, a smoothing circuit for smoothing the output pulse signal of the first delay circuit, a comparing circuit for comparing an output signal level of the smoothing circuit with a predetermined reference level and for producing a control signal which is supplied to the first and second delay circuits to control duty cycles of the output pulse signals to the first and second delay circuits constant, so as to produce the output pulse signal of the second delay circuit as an output pulse signal of the phase shifting circuit having a period which is essentially identical to that of the input pulse signal but having a phase which is shifted by a predetermined quantity with respect to a phase of the input pulse signal. According to the phase shifting circuit of the present invention, the circuit operation is unaffected by a change in the period of the input pulse signal. Furthermore, the phase of the output pulse signal may be ajusted to lead or lag the phase of the input signal by appropriately varying the predetermined reference level.

Still another object of the present invention is to provide a phase shifting circuit comprising a first delay circuit for delaying an input pulse signal, a second delay circuit for delaying an output pulse signal of the first delay circuit, a smoothing circuit for smoothing the output pulse signal of the first delay circuit, a comparing circuit for comparing an output signal level of the smoothing circuit with a predetermined reference level and for producing a control signal which is supplied to the first and second delay circuits to control duty cycles of the output pulse signals of the first and second delay circuits constant, and a shaping circuit for shaping the output pulse signal of the second delay circuit so as to produce an output pulse signal having a period and a pulse width essentially identical to those of the input pulse signal but has a phase which is shifted by a predetermined quantity with respect to a phase of the input pulse signal. According to the phase shifting circuit of the present invention, the circuit operation is unaffected by a change in the period of the input pulse signal.

Other objects and further features of the present invention will be apparent from the following detailed description when read in conjunction with the accompanying drawings.

BRIEF DESCRIPTION OF THE DRAWINGS

FIGS. 5(A) through 5(E) show signal waveforms for explaining the operation of the block system shown in FIG. 4; and FIG. 6 is a system circuit diagram showing an embodiment of the concrete circuit construction of the phase shifting circuit according to the present invention.

DETAILED DESCRIPTION

Generally, in a display device such as a television receiver which uses a picture tube, a starting point of the raster is determined by a synchronizing signal for both the horizontal and vertical directions on the screen. But in some cases, it is desirable to start the raster from a point which is shifted from the starting point determined by the synchronizing signal. For example, in the display device for a computer, it is necessary for the relative position between the synchronizing signal and the picture information to be freely adjustable since the time position relationship between the synchronizing signal and the picture displayed on a screen is different depending on the type of the computer.

Figure 1:
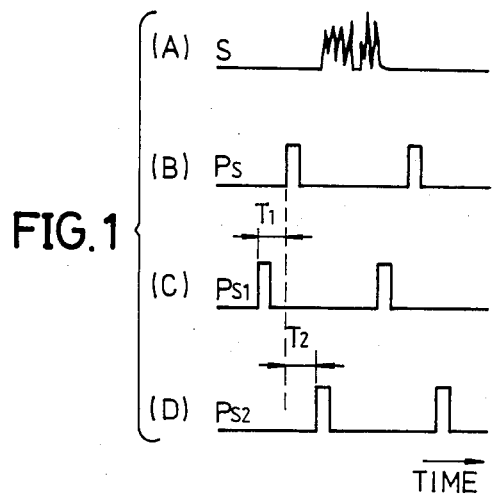
FIGS. 1(A) through 1(D) show signal waveforms for explaining the fundamental operation of the phase shifting circuit.

In other words, it will be useful if it is possible to produce a new pulse signal Ps1 shown in FIG. 1(C) which has the same period as an input synchronizing signal Ps shown in FIG. 1(B) of a picture information S shown in FIG. 1(A) and has a phase which leads the phase of the synchronizing signal Ps by a time T1 or a new pulse signal Ps2 shown in FIG. 1(D) which has the same period as the input synchronizing small Ps and has a phase which lags the phase of the synchronizing signal Ps by a time T2, and supply this new pulse signal Ps1 (or Ps2) to the display device as the synchronizing signal so as to determine the starting point of the raster. In this case, the relative position of the picture information S with respect to the new synchronizing signal changes, and it becomes possible to freely adjust the position of the picture on the screen. In the case where the synchronizing signal is a vertical synchronizing signal, for example, the picture can be moved upwardly and downwardly on the screen. On the other hand, the picture can be moved rightwardly and leftwardly in the case where the synchronizing signal is a horizontal synchronizing signal.

Figure 2:
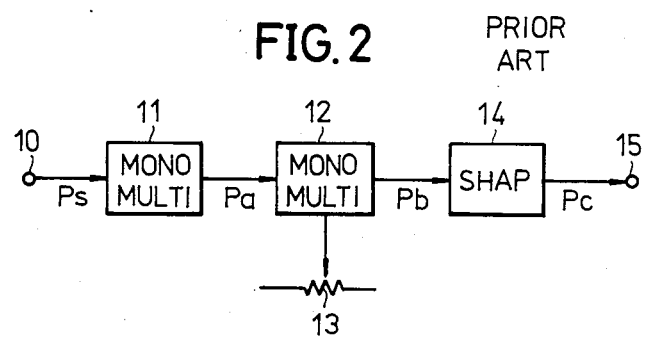
FIG. 2 is a system block diagram showing an example of the conventional phase shifting circuit.

As an example of a conventional phase shifting circuit which shifts the phase of an input pulse signal, there is a phase shifting circuit shown in FIG. 2 comprising first and second monostable multivibrators 11 and 12 and a shaping circuit 14. An input synchronizing signal Ps shown in FIG. 3(A) having a period Ts is applied to an input terminal 10 and is delayed in the first monostable multivibrator 11. The first monostable multivibrator 11 produces a pulse signal Pa shown in FIG. 3(B) which rises at times ta, td and the like when the synchronizing signal Ps rises and has a constant pulse width Tw1. The output pulse signal Pa of the first monostable multivibrator 11 is further delayed in the second monostable multivibrator 12.

Figure 3:
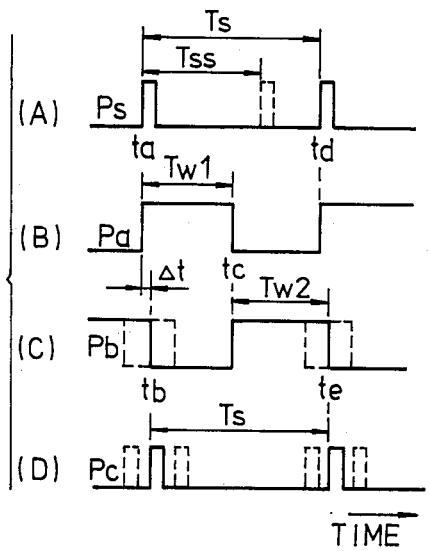
FIGS. 3(A) through 3(D) show signal waveforms for explaining the operation of the block system shown in FIG. 2.

The second monostable multivibrator 12 produces a pulse signal Pb shown in FIG. 3(C) which rises at times tc and the like when the pulse signal Pa falls and has a pulse width Tw2. This pulse width Tw2 can be varied by adjusting the resistance of a variable resistor 13 which is coupled to the second monostable multivibrator 12 for adjusting the time constant thereof. The output pulse signal Pb of the second monostable multivibrator 12 is shaped in the shaping circuit 14 into an output pulse signal Pc having a signal waveform shown in FIG. 3(D) which rises at times tb, te and the like when the pulse signal Pb falls, and this output pulse signal Pc is outputted via an output terminal 15.

Hence, the output pulse signal Pc which has the same period Ts and approximately the same pulse width as the input synchronizing signal Ps but is delayed by a predetermined time Δt is obtained from the output terminal 15. The phase of the output pulse signal Pc can be freely changed to lead or lag with respect to the phase of the input synchronizing signal Ps as indicated by phantom lines in FIG. 3(D) by adjusting the resistance of the variable resistor 13 so as to vary the pulse width Tw2 of the pulse signal Pb. Accordingly, the output pulse signal Pc can be supplied to the display device as the new synchronizing signal which determines the starting point of the raster so as to move the picture in the vertical or horizontal direction of the screen.

In the case where the period of the input synchronizing signal Ps is constant as in the case of the general television system, no problems will occur when the phase of the synchronizing signal Ps is shifted in the conventional phase shifting circuit shown in FIG. 2. However, in the case where picture information sources having different horizontal deflection frequencies coexist, problems described hereunder occur when the phase of the synchronizing signal is shifted in the conventional phase shifting circuit. For example, picture information sources such as computers and high definition television systems have horizontal deflection frequencies in the range of 15 kHz to 30 kHz.

In other words, when the phase shifting circuit having the output pulse widths Tw1 and Tw2 of the first and second monostable multivibrators 11 and 12 set in accordance with the period of the input synchronizing signal Ps from a first picture information source receives from a second picture information source a second synchronizing signal having a period Tss shorter than the period Ts as indicated by a phantom line in FIG. 3(A), the phase of the output pulse signal (output synchronizing signal) Pc becomes greatly deviated from the second synchronizing signal unless the pulse widths Tw1 and Tw2 are newly set in accordance with the short period Tss of the second synchronizing signal. In an extreme case where the period Tss of the second synchronizing signal is shorter than the output pulse width Tw1 of the first monostable multivibrator 11, no output pulse is obtained from the first monostable multivibrator 11 and the phase shifting circuit as a whole will become inoperative. Hence, in the display device which may receive various picture information having synchronziing signals of different techniques, the phase shifting circuit will not operate correctly unless the output widths Tw1 and Tw2 of the first and second monostable multivibrators 11 and 12 are adjusted every time the input picture information changes. For this reason, there are problems in that the circuit construction of the phase shifting circuit becomes complex and that it is troublesome to make the necessary adjustments every time the period of the input pulse signal changes.

Figure 4:
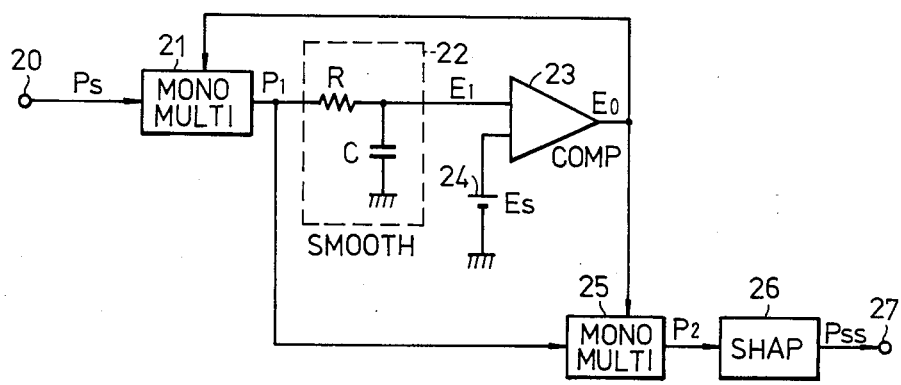
FIG. 4 is a system block diagram showing an embodiment of the phase shifting circuit according to the present invention.

Next, description will be given with respect to the present invention which eliminates the problems of the conventional phase shifting circuit. FIG. 4 shows an embodiment of the phase shifting circuit according to the present invention. An input synchronizing signal Ps shown in FIG. 5(B) of a picture information S shown in FIG. 5(A) and having a period Ts is applied to an input terminal 20 and is supplied to a first monostable multivibrator 21. The first monostable multivibrator 21 delays the input synchronizing signal Ps and produces a pulse signal P1 shown in FIG. 5(C) which rises at times t1, t4 and the like when the synchronizing signal Ps rises and has a pulse width Td1. The pulse signal P1 is supplied to a smoothing circuit 22 and to a second monostable multivibrator 25 which will be described later.

The smoothing circuit 22 comprises a resistor R and a capacitor C, and produces a D.C. voltage E1 by smoothing the pulse signal P1. As indicated by a phantom line in FIG. 5(C), the voltage E1 corresponds to an average voltage of the pulse signal P1. The output voltage E1 of the smoothing circuit 22 is supplied to a first input terminal of a comparator 23. A predetermined reference D.C. voltage Es is supplied to a second input terminal of the comparator 23 from a reference voltage source 24.

The comparator 32 compares the levels of the voltage E1 from the smoothing circuit 22 and the reference voltage Es and porduces an error voltage (hereinafter referred to as a control voltage) E0 which is dependent on the compared result. The control voltage E0 is supplied to the first and second monostable multivibrators 21 and 25. The control voltage E0 controls the time constant of the first monostable multivibrator 21 so that the voltage E1 becomes equal to the reference voltage Es, that is, controls the pulse width Td1 of the pulse signal P1 produced from the first monostable multivibrators 21 so that the duty cycle of the pulse signal P1 is maintained constant. When it is assumed that the high level value of the pulse signal P1 is equal to a power source voltage Vcc and the reference voltage Es is equal to Vcc/2, the pulse width Td1 is controlled to become equal to Ts/2 responsive to the control voltage E0. The duty cycle of the pulse signal P1 can be varied by appropriately adjusting the reference voltage Es.

On the other hand, the second monostable multivibrator 25 delays the pulse signal P1 and produces a pulse signal P2 shown in FIG. 5(D) which rises at times t3, t6 and the like when the pulse signal P1 falls and has a pulse width Td2. The pulse signal P2 is supplied to a shaping circuit 26. The time constant of the second monostable multivibrator 25 is also controlled by the control voltage E0 from the comparator 23, and the pulse width Td2 is dependent on the time constant of the second monostable multivibrator 25. As will be described later, the time constants of the first and second monostable multivibrators 21 and 25 are not necessarily the same, and the pulse widths Td1 and Td2 may be different. However, as may be seen from FIGS. 5(B) through 5(D), the period (between the times t1 and t4, or between the times t3 and t6) of the pulse signal P1 and the period (between the times t2 and t5, or between the times t3 and t6) of the pulse signal P2 are respectively equal to the period Ts of the input synchronizing signal Ps.

The shaping circuit 26 shapes the pulse signal P2 into an ouptut pulse signal Pss having a signal waveform shown in FIG. 5(E) which rises at the times t2, t5 and the like when the pulse signal P2 rises and has a pulse width approximately equal to the pulse width of the input synchronizing signal Ps. The output pulse signal Pss is outputted via an output terminal 27. The output pulse signal Pss has the same period Ts as the input synchronizing signal Ps, and the phase of the output pulse signal Pss is delayed by a time $\Delta T$ with respect to the phase of the input synchronizing signal Ps.

Therefore, according to the present embodiment, it is possible to obtain the output pulse signal Pss which has the same period Ts as the input synchronizing signal Ps and has a phase shifted with respect to the phase of the input synchronizing signal Ps by a predetermined quantity ($\Delta T$). The periods of the pulse signals P1, P2 and Pss change accordingly when the periods Ts of the input synchronizing signal Ps changes. The pulse widths Td1 and Td2 of the respective pulse signals P1 and P2 may be changed by changing the value of the reference voltage Es. Thus, the phase of the output pulse signal Pss can be freely changed to lead or lag with respect to the phase of the input synchronizing signal Ps by appropriately adjusting the pulse widths Td1 and Td2.

Accordingly, in the case where the output pulse signal Pss is supplied to a deflection circuit or the like within the display device as the new synchronizing signal which determines the starting point of the raster, it is possible to change the time position relationship between the picture information S and the new synchronizing signal (Pss) and move the picture to an arbitrary position on the screen.

In the case where the deflection circuit or the like coupled to the stage subsequent to the phase shifting circuit of the present invention is designed to be triggered responsive to falling edges of the incoming synchronizing signal, it is possible to omit the shaping circuit 26 and supply the output pulse signal P2 of the second monostable multivibrator 25 directly to the deflection circuit or the like.

Next, description will be given with respect to an embodiment of the concrete circuit construction of the phase shifting circuit according to the present invention by referring to FIG. 6. In FIG. 6, those parts which are the same as those corresponding parts in FIG. 4 are designated by the same reference numerals, and description thereof will be omitted. In FIG. 6, an operational amplifier 30 is used instead of the comparator 23 shown in FIG. 4, and constant current circuits 33 and 34 are additionally provided. The constant current circuits 33 and 34 substantially constitute the comparator 23 together with the operational amplifier 30. The constant current circuit 33 comprises an NPN type transistor Q1, a PNP type transistor Q2, and resistors R1 and R2. The constant current circuit 34 comprises an NPN type transistor Q3, a PNP type transistor Q4, and resistors R3 and R4. The shaping circuit 26 comprises a coupling capacitor C3, a PNP type transistor Q5, and resistors R5 and R6.

For example, an integrated circuit MN4538B manufactured by Matsushita Electronic Industries Ltd. of Japan may be used for first and second monostable multivibrators 21 and 25.

A connection point of the resistor R and the capacitor C of the smoothing circuit 22 is coupled to an inverting input terminal of the operational amplifier 30. A power source line 35 for supplying the power source voltage Vcc is grounded via a resistor R7, a variable resistor R8 and a resistor R9 which are coupled in series. A non-inverting input terminal of the operational amplifier 30 is coupled to a slider 36 of the variable resistor R8. Hence, the voltage E1 is supplied to the inverting input terminal of the operational amplifier 30, and the reference voltage Es which is obtained by dividing the power source voltage Vcc by the resistors R7 through R9 is supplied to the non-inverting input terminal of the operational amplifier 30. The reference voltage Es increases when the slider 36 is slid in a direction A, and the reference voltage Es decreases when the slider 36 is slid in a direction B.

An output terminal of the operational amplifier 30 is coupled to the bases of the transistors Q1 and Q3. The collector of the transistor Q1 is coupled to the power source line 35. The emitter of the transistor Q1 is coupled to the base of the transistor Q2 and is also grounded via the resistor R1. The emitter of the transistor Q2 is coupled to the power source line 35 via the resistor R2. The collector of the transistor Q2 is coupled to the first monostable multivibrator 21 and is also grounded via a capacitor C1.

On the other hand, the collector of the transistor Q3 is coupled to the power source line 35. The emitter of the transistor Q3 is coupled to the base of the transistor Q4 and is also grounded via the resistor R3. The emitter of the transistor Q4 is coupled to the power source line 35 via the resistor R4. The collector of the transistor Q4 is coupled to the second monostable multivibrator 25 and is also grounded via a capacitor C2.

The output terminal of the second monostable multivibrator is coupled to the base of the PNP type transistor Q5 via the capacitor C3. The emitter of the transistor Q5 is coupled to the power source line 35, and the resistor R5 is coupled between the emitter and the base of the transistor Q5. The collector of the transistor Q5 is coupled to the output terminal 27 and is also grounded via the resistor R6.

The capacitors C1 and C2 determine the time constants of the respective first and second monostable multivibrators 21 and 25. Hence, the pulse widths Td1 and Td2 are determined by the curves of the charging characteristics of the capacitors C1 and C2. The operational amplifier 30 compares the voltage E1 and the reference voltage Es and produces the control voltage E0 which decreases when E1>Es and increases when E1<Es.

Next, description will be given with respect to the operation of the circuit system shown in FIG. 6. When base-emitter voltages of the transistors Q1 and Q2 are respectively denoted by Vbe1 and Vbe2, an emitter voltage Ve1 of the transistor Q1 can be described by the following equation (1).

$$Ve1 = E0 - Vbe1 \quad (1)$$

From the equation (1), an emitter voltage Ve2 of the transistor Q2 can be described by the following equation (2).

$$Ve2 = Ve1 + Vbe2 = E0 - Vbe1 + Vbe2 \quad (2)$$

Accordingly, when the characteristics of the transistors Q1 and Q2 are the same and Vbe1=Vbe2, it can be seen from the equation (2) that E0=Ve2. Hence, when the resistance of the resistor R2 is denoted by r, an emitter current Ie2 of the transistor Q2 can be described by the following equation (3).

$$Ie2 = (Vcc - E0)/r \quad (3)$$

The emitter current Ie2 flows to the capacitor C1 via the emitter and the collector of the transistor Q2 to charge the capacitor C1. As a result, since the control voltage E0 decreases when E1>Es, the emitter current (that is, the charging current) Ie2 flowing to the capacitor C1 increase to rapidly charge the capacitor C1. Thus, the pulse width Td1 of the pulse signal P1 becomes narrow and the output voltage E1 of the smoothing circuit 22 decreases. The operation to decrease the voltage E1 continues until the voltage E1 becomes equal to the reference voltage Es. Accordingly, the duty cycle of the pulse signal P1 changes depending on the magnitude of the reference voltage Es, independently of the frequency (period) of the input synchronizing signal Ps.

On the other hand, in the case where E1<Es, the control voltage E0 increases, and the charging current Ie2 of the capacitor C1 decreases due to the relationship described by the equation (3). As a result, the charging of the capacitor C1 becomes gradual, the pulse width Td1 becomes wide, and the voltage E1 increases. The operation to increase the voltage E1 continues until the voltage E1 becomes equal to the voltage Es.

Therefore, the voltage E1 is always controlled so as to coincide with the reference voltage Es, and the pulse width Td1 of the pulse signal P1 produced by the first monostable multivibrator 21 is finally determined by the reference voltage Es.

The constant current circuit 34 carries out an operation similar to that of the constant current circuit 33 described heretofore. Hence, a charging current proportional to the charging current Ie2 of the capacitor C1 is supplied to the capacitor C2. Hence, the pulse width Td2 of the pulse signal P2 produced by the second monostable multivibrator 25 changes proportionally to the change in the pulse width Td1 of the pulse signal P1. Thus, the pulse width Td2 of the pulse signal P2 is also finally determined by the reference voltage Es.

The pulse signal P2 is differentiated in a differentiating circuit constituted by the coupling capacitor C3 and the resistor R5 and is thereafter supplied to the base of the transistor Q5. Accordingly the transistor Q5 is turned ON only for a short time after the falling edge of the pulse signal P2. While the transistor Q5 is ON, a current flows to the resistor R6 from the collector of the transistor Q5, and the positive polarity pulse signal Pss shown in FIG. 5(D) is outputted via the output terminal 27.

According to the present embodiment, the pulse widths Td1 and Td2 of the pulse signals P1 and P2 can be varied proportionally to the reference voltage Es by moving the slider 36 to adjust the reference voltage Es. For this reason, the phase of the output pulse signal Pss can be freely changed to lead or lag with respect to the phase of the input synchronizing signal Ps. In addition, the phase relationship between the output pulse signal Pss and the input synchronizing signal Ps is virtually unaffected by the period Ts of the input synchronizing signal Ps.

The shaping circuit 26 shown in FIG. 6 is constituted by the capacitor C3, the transistor Q5 and the resistors R5 and R6, but the construction of the shaping circuit 26 shown in FIG. 4 is not limited to that shown in FIG. 6 and may be constituted by a monostable multivibrator, for example.

According to the present invention, the phase of the output pulse signal can be freely changed to lead or lag with respect to the phase of the input pulse signal, without being affected by the period of the input synchronizing signal. For this reason, when the phase shifting circuit of the present invention is applied to a phase shifting circuit for shifting the phase of a synchronizing signal in a display device which is designed to receive various picture information having synchronizing signals of different frequencies, for example, it becomes possible to change the position of the picture to an arbitrary position on a screen regardless of a frequency change in the synchronizing signal.

Further, the present invention is not limtied to these embodiments, but various variations and modifications may be made without departing from the scope of the present invention.

What is claimed is:

1. A phase shifting circuit for shifting a phase of an input pulse signal, said phase shifting circuit comprising:
   a first delay circuit for delaying said input pulse signal so as to produce a first pulse signal having a first pulse width;
   a second delay circuit for delaying said first pulse signal so as to produce a second pulse signal having a second pulse width;
   a smoothing circuit for smoothing said first pulse signal; and
   a comparing circuit for comparing an output signal level of said smoothing circuit with a predetermined reference level so as to produce a control signal dependent on a difference between the two compared levels, said control signal being supplied to said first and second delay circuits to control delay times thereof so that said first and second pulse widths respectively become constant,
   said second delay circuit producing said second pulse signal as an output pulse signal of the phase shifting circuit having a period essentially identical to that of said input pulse signal but having a phase which is shifted by a predetermined quantity with respect to the phase of said input pulse signal, said predetermined quantity being substantially constant regardless of a period of said input pulse signal.

2. A phase shifting circuit as claimed in claim 1 which further comprises a variable reference level source for supplying to said comparing circuit a reference level which is variable so that the phase of said output pulse signal of the phase shifting circuit is adjustable to constantly lead or lag the phase of said input pulse signal by said predetermined quantity, said first and second pulse widths changing proportionally to a change in said reference level and determining said predetermined quantity.

3. A phase shifting circuit as claimed in claim 1 in which said first and second delay circuits respectively comprise a monostable multivibrator having a time constant thereof controlled responsive to said control signal.

4. A phase shifting circuit as claimed in claim 1 in which said smoothing circuit produces a signal having an average level of said first pulse signal.

5. A phase shifting circuit as claimed in claim 1 in which said comparing circuit comprises an operational amplifier for producing an error signal dependent on a level difference between the output signal level of said smoothing circuit and said reference level, a first constant current circuit for producing a first control signal responsive to said error signal and a second constant current circuit for producing a second control signal responsive to said error signal, said first and second control signals being supplied to said first and second delay circuits as said control signal, respectively.

6. A phase shifting circuit for shifting a phase of an input pulse signal, said phase shifting circuit comprising:
   a first delay circuit for delaying said input pulse signal so as to produce a first pulse signal having a first pulse width;
   a second delay circuit for delaying said first pulse signal so as to produce a second pulse signal having a second pulse width;
   a smoothing circuit for smoothing said first pulse signal;
   a comparing circuit for comparing an output signal level of said smoothing circuit with a predetermined reference level so as to produce a control signal dependent on a difference between the two compared levels, said control signal being supplied to said first and second delay circuits to control delay times thereof so that said first and second pulse widths respectively become constant; and
   a shaping circuit for shaping a signal waveform of said second pulse signal so as to produce an output pulse signal of the phase shifting circuit having a period and a pulse width essentially identical to those of said input pulse signal but having a phase which is shifted by a predetermined quantity with respect to the phase of said input pulse signal, said predetermined quantity being substantially constant regardless of a period of said input pulse signal.

7. A phase shifting circuit as claimed in claim 6 which further comprises a variable reference level source for supplying to said comparing circuit a reference level which is variable so that the phase of said output pulse signal of the phase shifting circuit is adjustable to constantly lead or lag the phase of said input pulse signal by said predetermined quantity, said first and second pulse widths changing proportionally to a change in said reference level and determining said predetermined quantity.

8. A phase shifting circuit as claimed in claim 6 in which said first and second delay circuits respectively comprise a monostable multivibrator having a time constant thereof controlled responsive to said control signal.

9. A phase shifting circuit as claimed in claim 6 in which said smoothing circuit produces a signal having an average level of said first pulse signal.

10. A phase shifting circuit as claimed in claim 6 in which said comparing circuit comprises an operational amplifier for producing an error signal dependent on a level difference between the output signal level of said smoothing circuit and said reference level, a first constant current circuit for producing a first control signal responsive to said error signal and a second constant current circuit for producing a second control signal responsive to said error signal, said first and second control signals being supplied to said first and second delay circuits as said control signal, respectively.

* * * * *